US008675381B2

(12) United States Patent
Lue et al.

(10) Patent No.: US 8,675,381 B2
(45) Date of Patent: Mar. 18, 2014

(54) TRANSISTOR HAVING AN ADJUSTABLE GATE RESISTANCE AND SEMICONDUCTOR DEVICE COMPRISING THE SAME

(75) Inventors: Hang-Ting Lue, Hsinchu (TW); Kuo-Pin Chang, Miaoli County (TW)

(73) Assignee: Macronix International Co., Ltd. (TW)

( * ) Notice: Subject to any disclaimer, the term of this patent is extended or adjusted under 35 U.S.C. 154(b) by 165 days.

(21) Appl. No.: 12/839,842

(22) Filed: Jul. 20, 2010

(65) Prior Publication Data

US 2012/0020138 A1 Jan. 26, 2012

(51) Int. Cl.
*G11C 5/06* (2006.01)

(52) U.S. Cl.
USPC ........................ 365/63; 365/174; 365/189.011

(58) Field of Classification Search
None
See application file for complete search history.

(56) References Cited

U.S. PATENT DOCUMENTS 7,307,880 B2 12/2007 Ko et al.
2002/0163030 A1* 11/2002 Mandell et al. ............... 257/314
2004/0120186 A1* 6/2004 Fasoli et al. ................ 365/185.2
2006/0152961 A1* 7/2006 Kim et al. ..................... 365/148
2006/0223251 A1* 10/2006 Isogai ........................... 438/197
2009/0310424 A1* 12/2009 Berco ...................... 365/185.29

FOREIGN PATENT DOCUMENTS

CN 1518775 A 8/2004
TW 544860 9/2010

OTHER PUBLICATIONS

Office Action from Chinese patent application 201010233479.5 dated Nov. 2, 2012.

* cited by examiner

*Primary Examiner* — Huan Hoang
*Assistant Examiner* — James G Norman
(74) *Attorney, Agent, or Firm* — Baker & McKenzie LLP

(57) ABSTRACT

A memory device comprises an array of memory cells each capable of storing multiple bits of data. The memory cells are arranged in memory strings that are connected to a common source line. Each memory cell includes a programmable transistor connected in series with a resistance. The transistor includes a gate dielectric that is switchable between a plurality of different resistance values. The threshold voltage of the transistor changes according to the resistance value of the gate dielectric. Memory states of the memory cells can thus be associated with respective resistance values of the dielectric layer of the transistor.

20 Claims, 9 Drawing Sheets

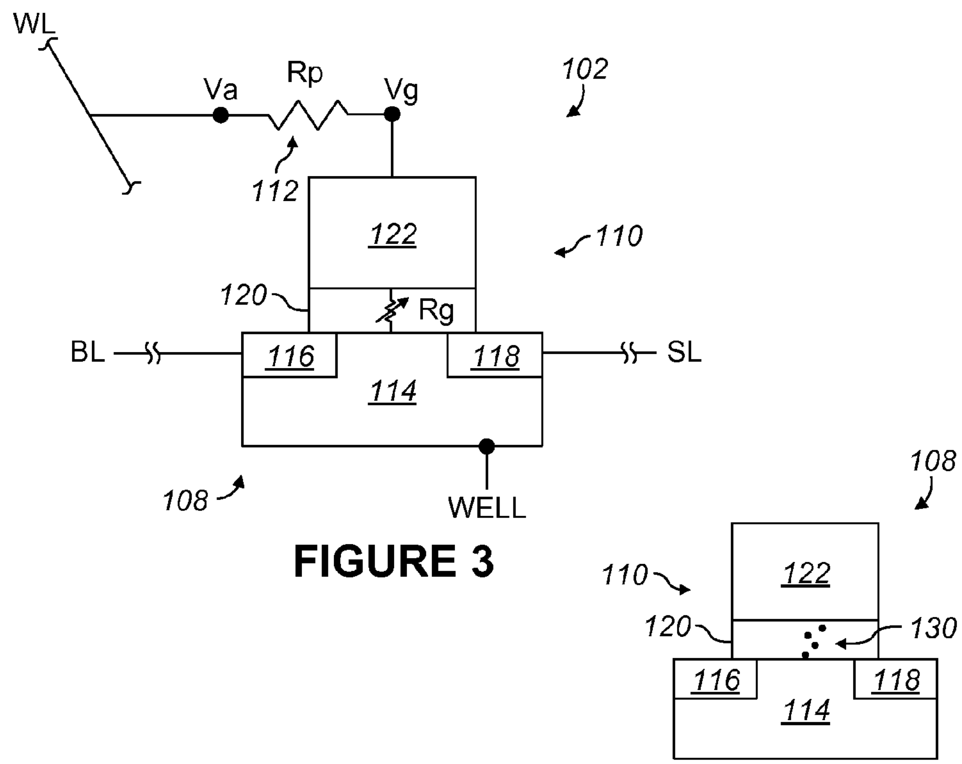
FIGURE 3
FIGURE 5
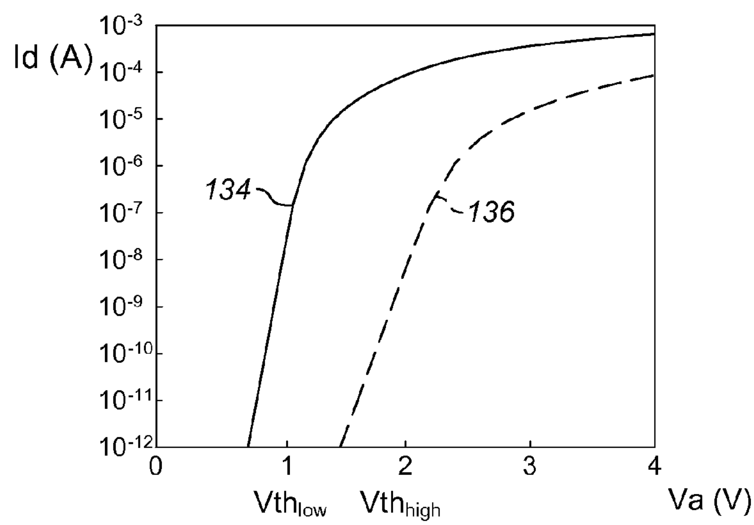
FIGURE 4

TRANSISTOR HAVING AN ADJUSTABLE GATE RESISTANCE AND SEMICONDUCTOR DEVICE COMPRISING THE SAME

BACKGROUND

1. Technical Field

The present invention relates to electronic memory devices, and more particularly, to semiconductor memory devices suitable for use as a nonvolatile memory devices.

2. Related Art

Electronic memory devices are well known and commonly found in a variety of electronic systems. For example, electronic memory devices (sometimes referred to as computer memory) can be found in computers and other computing devices. Various removable or stand-alone electronic memory devices are also known, such as memory cards or solid-state data storage systems. For example, it is known to use a removable memory card for storing pictures on a digital camera or for storing movies recorded with a digital video recorder.

Most electronic memory devices can be classified as either volatile or nonvolatile. A volatile electronic memory device is, in general, one which requires power in order to maintain the stored information. An example of a volatile electronic memory device is a Static Random Access Memory (SRAM) or Dynamic Random Access Memory (DRAM) computer memory device, which only retains the stored data while the computer is on, and which loses the stored data when the computer is turned off or otherwise loses power. In contrast, a nonvolatile electronic memory device is, in general, one which is capable of retaining stored data in the absence of an external power source. An example of a nonvolatile memory is a memory card such as those commonly used with digital cameras. Such a memory card can record a picture taken with the camera, and can retain the picture data even while the memory card is removed from the camera.

As the systems that use electronic memory devices become more powerful, the demand for data storage capacity increases as well. For example, more powerful computers and software generally operate better with increased amounts of random access memory (RAM); higher resolution cameras create larger picture and movie files that are better accommodated by memory cards having larger storage capacity. Thus, a trend in the electronic memory device industry has been to find ways of increasing the data storage capacity of memory devices. However, it is not sufficient to simply increase capacity—it is often equally desirable to maintain, or even reduce, the size of a memory device while increasing the data storage capacity. Thus, another trend has been towards increasing the amount of data storage for a given size, in other words towards greater bit density. Still another consideration is cost. For example, it is desirable to maintain or reduce the cost of an electronic memory device as the bit density increases. In other words, it is desirable to reduce the bit cost (cost per bit) of electronic memory devices. Still further considerations are performance related, such as providing faster storage of data and faster access to data stored on an electronic memory device.

One approach to providing increased bit density has been to reduce the size of individual memory cells. For example, as manufacturing processes are improved, smaller structures can be formed, thereby allowing for the manufacture of smaller memory cells. However, some projections indicate that bit cost will begin to increase using this approach in the future, because at some point the process cost will likely begin to increase more rapidly than the memory-cell-reduction rate. Thus, it is desirable to find alternative approaches for increasing the bit density of electronic memory devices.

SUMMARY

Memory devices and methods associated with memory devices are disclosed herein. According to one aspect of the present disclosure, a memory device can comprise an array of memory cells, where at least one of the memory cells comprises a transistor having a first terminal, a second terminal, and a gate structure, the gate structure including a gate dielectric layer. The memory cell also comprises a resistor in series with the gate structure of the transistor. The gate dielectric is switchable between first and second different resistances associated with respective first and second memory states.

The first resistance of the gate dielectric can be associated with a soft breakdown (SBD) condition of the transistor. The second resistance of the gate dielectric can be associated with an at least partially reversed SBD condition of the transistor.

The transistor can further include a well terminal. At least one of a read, program, and erase operation can include application of a predetermined voltage to the well terminal. The program operation can include application of the predetermined voltage to the gate structure, and the erase operation can include application of the predetermined voltage to the well terminal. The program operation can induce the SBD condition of the transistor. The erase operation can at least partially reverse the SBD condition of the transistor.

The gate dielectric layer can include at least one of silicon dioxide ($SiO_2$), hafnium dioxide ($HfO_2$), zirconium dioxide ($ZrO_2$), and titanium dioxide ($TiO_2$).

The resistor can comprise a high-resistance layer and the gate structure can comprise a low-resistance layer. The high-resistance layer can be disposed between the gate dielectric layer and the low-resistance layer.

According to another aspect of the present disclosure, a memory device can comprise a bit line, a word line, a memory string comprising a memory cell, and a common source line connected to the memory string. The memory string is connected to the bit line. The memory cell is connected between the common source line and the bit line. The memory cell comprises a transistor having a first terminal, a second terminal, and a gate structure, the gate structure including a gate dielectric layer. The memory cell also comprises a resistor that is electrically in series between the gate dielectric layer of the transistor and the word line. The gate dielectric is switchable between first and second different resistances associated with respective first and second memory states.

The first resistance of the gate dielectric can be associated with a soft breakdown (SBD) condition of the transistor. The second resistance of the gate dielectric can be associated with an at least partially reversed SBD condition of the transistor.

The transistor can further include a well terminal. At least one of a read, program, and erase operation can include application of a predetermined voltage to the well terminal. The program operation can include application of the predetermined voltage to the gate structure, and the erase operation can include application of the predetermined voltage to the well terminal. The program operation can induce the SBD condition of the transistor. The erase operation can at least partially reverse the SBD condition of the transistor.

The gate dielectric layer can include at least one of silicon dioxide ($SiO_2$), hafnium dioxide ($HfO_2$), zirconium dioxide ($ZrO_2$), and titanium dioxide ($TiO_2$). The resistor can comprise a high-resistance layer and the gate structure comprises a low-resistance layer, and wherein the high-resistance layer is disposed between the gate dielectric layer and the low-resistance layer.

The memory cell can be a first memory cell, and the memory device can further comprise a second memory cell formed above the first memory cell in a lamination direction such that the first and second memory cells are included in a three-dimensional memory array.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which:

FIG. 3 shows a schematic diagram of a memory cell of the memory device shown in FIG. 1;

FIG. 4 shows a graphical representation of a relationship between gate resistance and threshold voltage of the resistor of the memory cell shown in FIG. 3; and FIG. 5 shows a schematic view of a transistor of the memory cell shown in FIG. 3;

DETAILED DESCRIPTION

Figure 1:
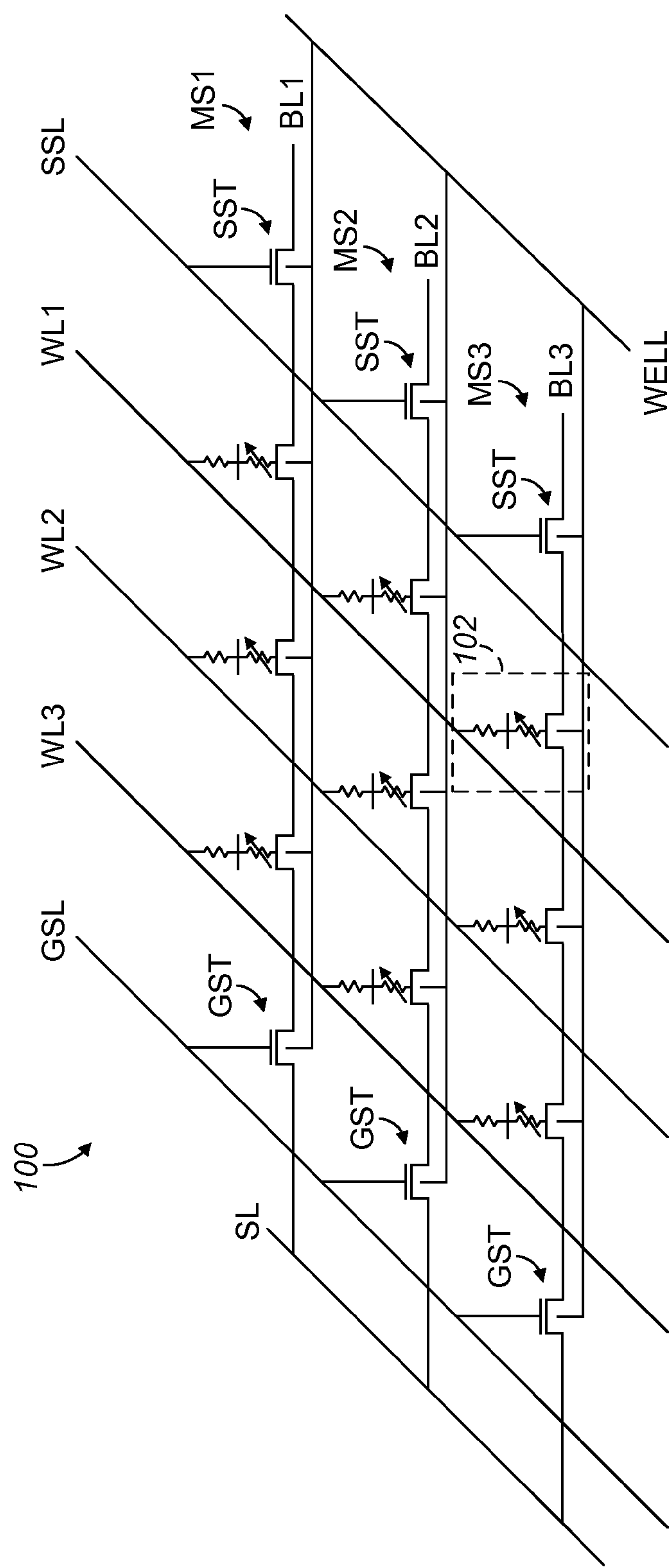
FIG. 1 a block diagram of a memory array in accordance with an embodiment of the present disclosure.

FIG. 1 shows a block diagram of a memory array 100 in accordance with an embodiment of the present disclosure. The memory array 100 can include a plurality of memory cells 102, a plurality of bit lines BL1-BL3, a plurality of word lines WL1-WL3, a string select line SSL, a ground select line GSL, and a common source line SL.

The memory array 100 can be configured such that the memory cells 102 are arranged in an array of m×n memory cells 102, where m and n represent respective natural numbers. More specifically, the memory array 100 can be configured such that the memory cells 102 are arranged into a plurality of memory strings MS1-MS3. Each of the memory strings MS includes a respective string select transistor SST, a respective group of n memory cells 102, and a respective ground select transistor GST connected in series. The memory strings MS1-MS3 are connected to respective bit lines BL1-BL3. The memory strings MS1-MS3 are all connected to the common source line SL.

Figure 2:
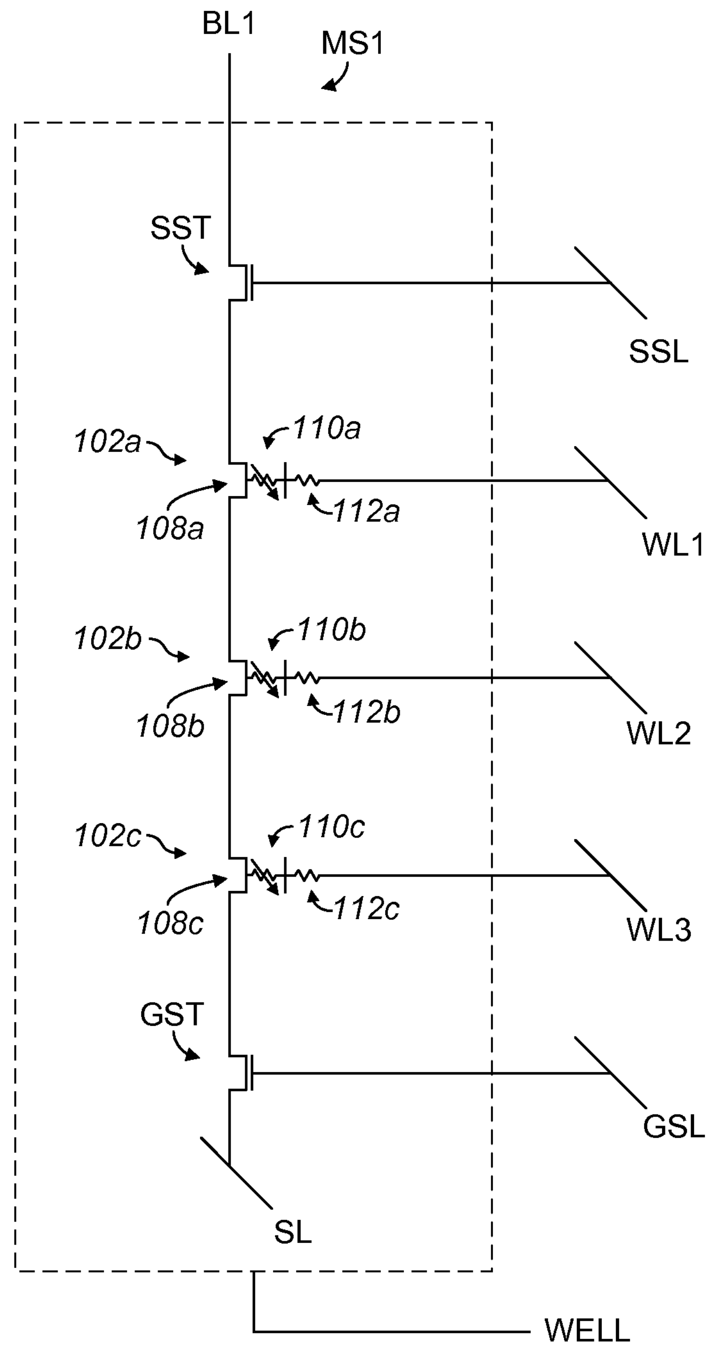
FIG. 2 shows a schematic diagram of a memory string of the memory device shown in FIG. 1.

FIG. 2 shows a schematic diagram of memory string MS1, which serves as an example of a memory string that can be used as any of the memory strings MS1-MS3 shown in FIG. 1. The memory string MS1 includes a string select transistor SST, first through fourth memory cells 102*a*-102*d*, and a ground select transistor GST. The string select transistor SST, first through third memory cells 102*a*-102*c*, and ground select transistor GST are connected in series between bit line BL1 and common source line SL. While the memory string MS1 includes three memory cells 102*a*-102*c*, actual implementations can include additional memory cells, for example 16, 32, 64 or more memory cells as desired. First through third memory cells 102*a*-102*c* include respective transistors 108*a*-108*c*. The transistors 108*a*-108*c* include respective adjustable-resistance gates 110*a*-110*c*. The memory cells 102*a*-102*c* also include respective resistors 112*a*-112*c*. Also, in some embodiments, neighboring transistors 108 can share a common source and/or common drain in order to minimize the cell size. If neither the source nor the drain are common structures in neighboring transistors, it is difficult to achieve a desired design rule that is not larger than 4 $F^2$.

The gate of the string select transistor SST is connected to the string select line SSL. The source of the string select transistor SST is connected to the bit line BL1. The drain of the string select transistor SST is connected to the first memory cell 102*a*.

The gate of the ground select transistor GST is connected to the ground select line GSL. The source of the ground select transistor GST is connected to the last memory cell 102*c*. The drain of the ground select transistor GST is connected to the common source line SL.

FIG. 3 shows a schematic diagram of a memory cell 102 according to an embodiment of the present disclosure. The memory cells 102*a*-102*c* can be configured as shown in FIG. 3. The memory cell 102 includes a transistor 108 and a resistor 112. The transistor 108 includes a adjustable-resistance gate 110.

The transistor 108 can be a field-effect transistor (FET), such as a metal-oxide-semiconductor field-effect transistor (MOSFET). The transistor 108 can include a semiconductor substrate 114, a source 116, a drain 118, and gate 110. The gate 100 includes a gate dielectric 120 and a gate electrode 122. The source 116 of the transistor 108 is connected to the bit line BL through a string select transistor SST and any intervening memory cells 102 as shown in FIG. 2. The drain 118 of the transistor 108 is connected to the common source line SL through a ground select transistor GST and any intervening memory cells 102 as shown in FIG. 2. The gate electrode 122 of the transistor 108 is connected to the word line WL through the resistor 112. The semiconductor substrate 114 is connected to an array well contact lead.

The resistor 112 can be a fixed resistor having a fixed electrical resistance Rp. The resistor 112 is connected in series with the gate 110, which has a variable gate resistance Rg that can be adjusted as described herein. The memory cell 102 receives an applied cell voltage Va from the word line WL. A voltage drop (Va−Vg) occurs across the resistor 112 such that a gate voltage Vg is applied to the gate 110 of the transistor 108. The gate voltage Vg can be shown to be related to the applied voltage Va according to the following equation (1) below.

$$Vg = Va\left(\frac{Rg}{Rp + Rg}\right) \quad (1)$$

Thus, the gate voltage Vg is dependent upon the gate resistance Rg. Accordingly, if the gate resistance Rg is controlled to change from one resistance value to another, the effective gate voltage Vg also changes, which also results in a different current.

FIG. 4 shows a simulation result of a MOSFET when the gate resistance Rg changes from 1 GΩ, which is represented by solid line 134, to 1 MΩ, which is represented by broken line 136. In this example, a MOSFET has a 3 nm gate oxide, a P-well doping of about 2E17 $cm^{-3}$, and the resistor 112 had a fixed resistance of 1 MΩ. The change in the resistance of Rg from 1 GΩ to 1 MΩ causes a shift in the threshold voltage Vth from a lower threshold voltage $Vth_{low}$, to a high threshold voltage $Vth_{high}$ as shown in FIG. 4. Thus, the adjustable-resistance transistor 108 experiences a threshold voltage Vth shift due to a change in gate resistance Rg, which is in contrast to floating gate transistors that experience a threshold voltage Vth shift caused by stored charge. The adjustable-resistance transistor 108 does not require a stored charge in order to experience a shift in the threshold voltage Vth.

The gate dielectric 120 can be formed of thin silicon dioxide ($SiO_2$). The resistance change in the gate 110 can be realized by utilizing a condition known as soft breakdown (SBD), which was previously considered undesirable. As shown in FIG. 5, in a newly manufactured MOS device, there are a random number of traps 130 in the gate oxide of the gate dielectric 120. Over time, due to operational stress, more traps 130 form, leading to small transient conductive paths through the oxide. During this process, current conduction is caused by a combination of conductive paths formed by oxide traps and tunneling through the gate oxide of the gate dielectric 120. The formation of these conductive paths is referred to as SBD. These conductive paths may become fixed by a high current density that causes a high temperature at the defect location. High temperature may alternatively relocate some of the oxide traps 130, breaking the conductive path. Instead of thin $SiO_2$, the gate dielectric 120 can be formed of a high-K material, which is material having a high dielectric constant or "K" above the "K" of silicon dioxide. Examples of suitable high-K material include hafnium dioxide ($HfO_2$), zirconium dioxide ($ZrO_2$), and titanium dioxide ($TiO_2$). High-K materials often have more trap sites than $SiO_2$, thus offering easier operation for changing the gate resistance Rg.

Figure 6:
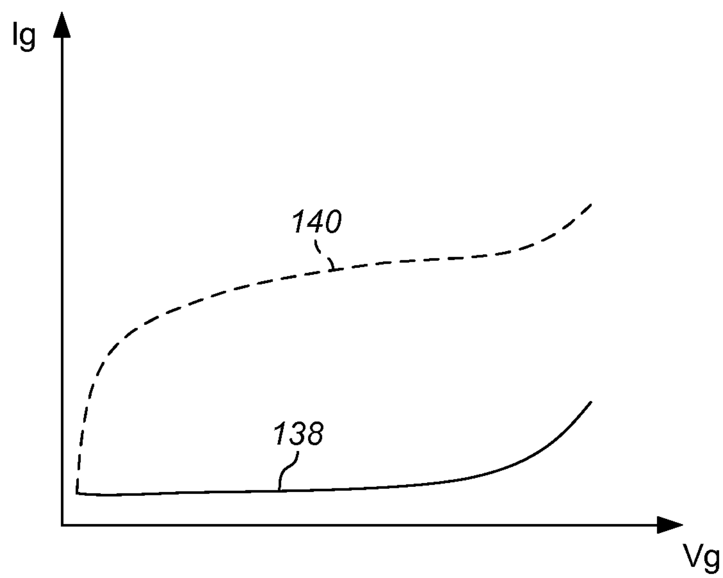
FIG. 6 shows a graphical representation of a relationship between the gate leakage current Ig and the gate voltage Vg for the transistor shown in FIGS. 3 and 5.

FIG. 6 shows a relationship between the gate leakage current Ig and the gate voltage Vg for the transistor 108 before SBD, which is represented by solid line 138, and after SBD, which is represented by broken line 140. For a thin gate dielectric 120 oxide layer, for example having a thickness that is less than 3 nm, the gate leakage current is generally smaller than 1 nA before SBD, which corresponds to a gate resistance Rg of more than 1 GΩ. In such a MOSFET, SBD can be induced in the gate dielectric 120 by applying a gate voltage Vg of approximately +4.3 V. After SBD occurs in the gate dielectric 120, the gate leakage current changes to approximately 1 •A, which corresponds to a gate resistance Rg of approximately 1 MΩ. The SBD uses much lower power consumption than conventional PCRAM or RRAM devices.

The characteristics of the adjustable-resistance transistor 108 can vary from those described above. For example, the thickness of the gate oxide and the P-well doping can vary from the example values presented above. Also, the resistance of the fixed resistor 112 can vary from the resistance value of 1 MΩ presented above.

Figure 7:
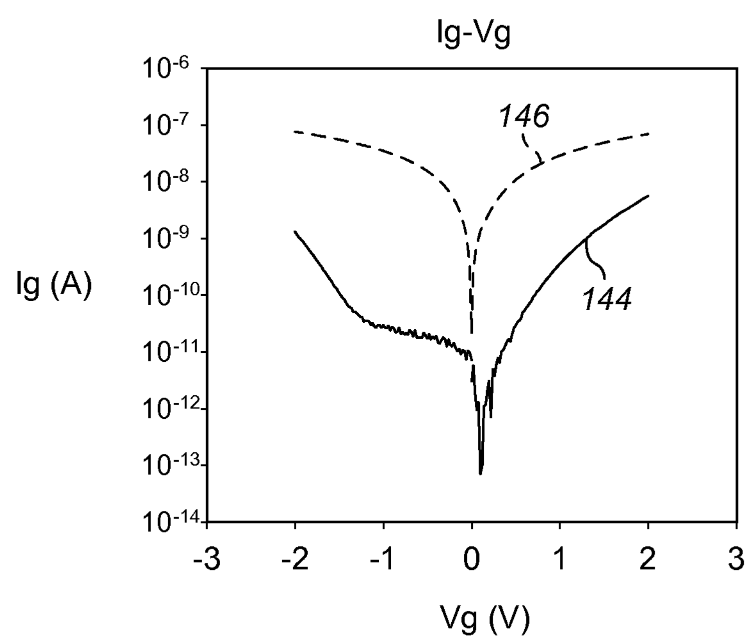
FIG. 7 shows a graphical representation of a relationship between the gate leakage current Ig and the gate voltage Vg for an alternative embodiment of the memory cell shown in FIG. 3.

For example, FIG. 7 shows a relationship between the gate leakage current Ig and the gate voltage Vg for an alternative embodiment of the memory cell 102. The transistor 108 is an N-channel MOSFET having a 1 nm gate oxide. The resistor 112 has a fixed resistance of 20 MΩ. The relationship between the gate leakage current Ig and the gate voltage Vg before SBD is shown as solid line 144, and the relationship after SBD is shown as broken line 146. In this embodiment, the initial pre-SBD gate oxide resistance Rg is about 1 GΩ. SBD can be induced using a pulse voltage of 4.3 V for about 1 μs. After SBD, the gate oxide resistance Rg is decreased and clamped by the fixed resistor 112. In this embodiment, the gate oxide resistance Rg after SBD is decreased to approximately 1 MΩ.

Figure 8:
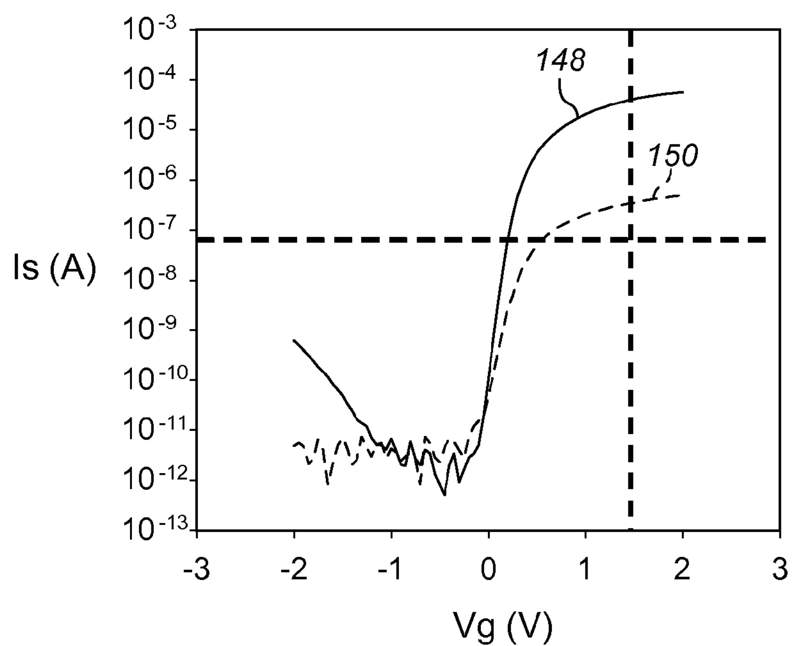
FIG. 8 shows source characteristics for the transistor shown in FIGS. 3 and 5.

FIG. 8 shows the source characteristics for the transistor 108 of this embodiment of the memory cell 102. The relationship between the source current Is and the gate voltage Vg before SBD is shown as solid line 148, and the relationship after SBD is shown as broken line 150. As shown in FIG. 8, the source current drops significantly after SBD, because the applied gate voltage drop is greater across the fixed resistance Rp of the resistor 112 than across the gate resistance Rg of the gate 110. Thus, the SBD results in a detectable drop in the drain/source current of the transistor 108. In this embodiment, the difference between the pre-SBD source current Is and the post-SBD source current Is is more than two orders of magnitude. As a result, the detectably different drain/source currents of the transistor 108 can be utilized as respective memory states of the memory cell 102.

Figure 9:
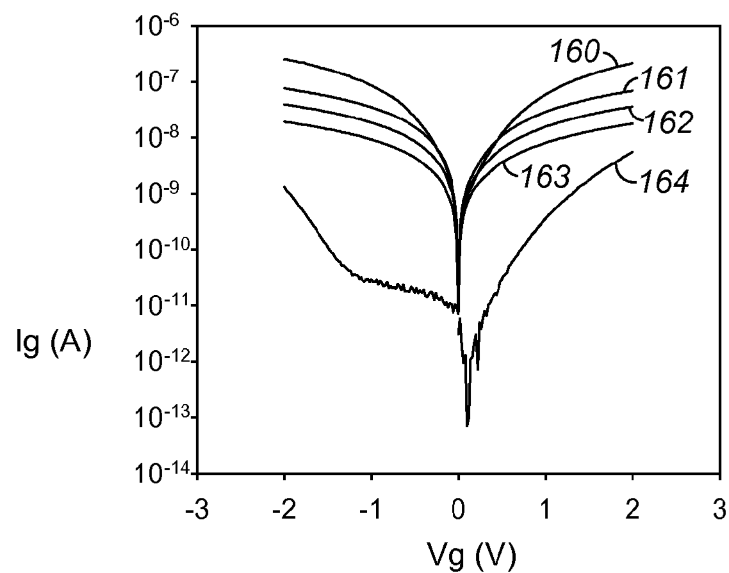
FIGS. 9 and 10 show simulation results revealing the effect of the resistance Rp on the behavior of the memory cell shown in FIG. 3.
Figure 10:
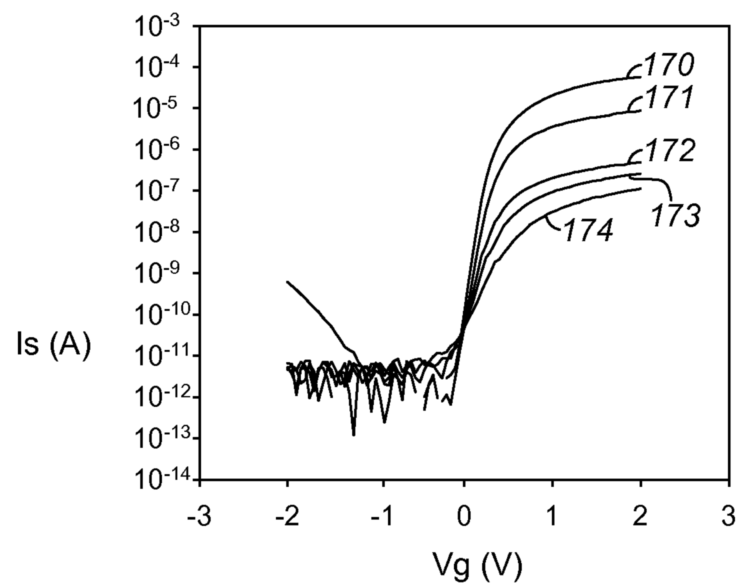

FIGS. 9 and 10 show simulation results revealing the effect of the resistance Rp on the behavior of the memory cell 102. More specifically, FIG. 9 shows the gate current characteristics of the transistor 108 for various resistance values of the fixed resistance Rp; FIG. 10 shows the source/drain current characteristics of the transistor 108 for various resistance values of the fixed resistance Rp. In FIG. 9, line 160 shows the result for the pre-SBD condition; line 161 shows the result when Rp=4.7 MΩ; line 162 shows the result when Rp=20 MΩ; line 163 shows the result when Rp=40 MΩ; and line 164 shows the result when Rp=80 MΩ. In FIG. 10, line 170 shows the result for the pre-SBD condition; line 171 shows the result when Rp=4.7 MΩ; line 172 shows the result when Rp=20 MΩ; line 173 shows the result when Rp=40 MΩ; and line 174 shows the result when Rp=80 MΩ. Thus, it can be seen from the simulation results shown in FIGS. 9 and 10 that the gate current and the drain/source current both decrease as the resistance value of the fixed resistance Rp is increased.

Figure 11:
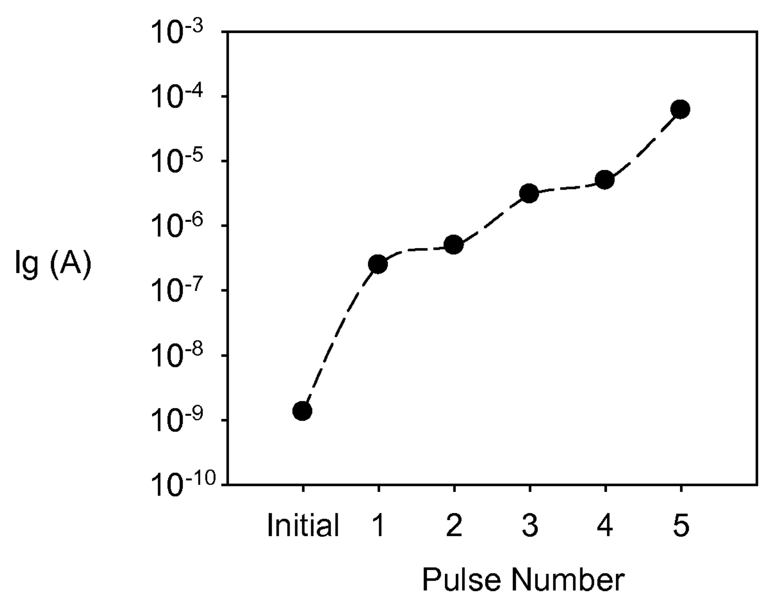
FIG. 11 shows the relationship between gate current Ig and the number of applied SBD-inducing voltage pulses to the gate of the transistor shown in FIGS. 3 and 5.

In some embodiments, the memory cell 102 can be used as a One Time Program (OTP) memory device. FIG. 11 shows the relationship between gate current Ig and the number of applied SBD-inducing voltage pulses to the gate 110 of the transistor 108. The gate current Ig changes progressively as SBD-inducing pulse voltages are applied to the transistor 108. The gate current Ig for a given READ voltage of +2 V increases as the number of applied SBD-inducing pulse voltages is increased. This occurs due to the progressive nature of the breakdown of the gate oxide. As a result, the memory cell 102 can be used as a multi-level OTP memory device. In such embodiments, a desired gate current Ig can be selected by applying a corresponding predetermined number of SBD-inducing voltage pulses to the gate 110 of the transistor 108.

Figure 12:
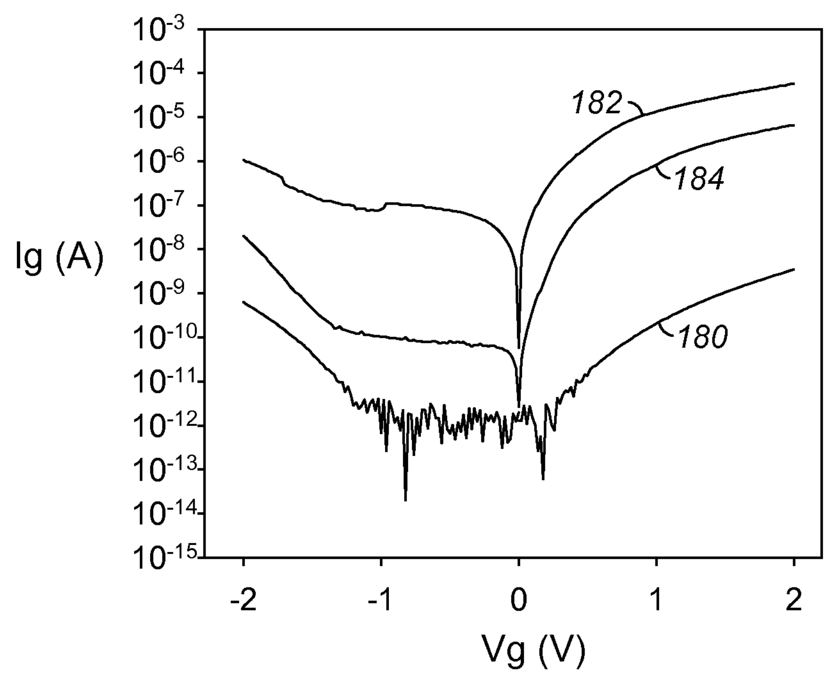
FIG. 12 shows gate characteristics of the transistor shown in FIGS. 3 and 5 for the pre-SBD condition, SBD condition, and at least partially reversed SBD condition.

In other embodiments, the memory cell 102 can be used as a rewritable memory device. FIG. 12 shows the gate characteristics of the transistor 108 according to simulation results for pre-SBD condition (line 180) and an SBD condition (line 182). The SBD condition represented by line 182 can be induced by applying a gate pulse voltage for a predetermined period of time. In the simulated example, the SBD condition is induced by applying a pulse voltage of 4.3 V using a pulse having a pulse width of approximately 1 μs.

However, the SBD condition can be at least partially reversed by application of a pulse voltage having the opposite polarity of the voltage used to induce the SBD condition. Also, the pulse width of the SBD-reversing pulse voltage can be different from the pulse width of the SBD-inducing pulse voltage. The gate characteristics of the transistor 108 in the partially-reversed SBD condition is represented in FIG. 12 by line 184. In the illustrated example, the partially-reversed SBD condition was achieved by application of a pulse voltage of −4.3 V using a pulse having a pulse width of approximately 3 μs.

The SBD condition of the transistor 108 can thus be at least partially reversed to the extent that the gate characteristics of the transistor 108 while in the SBD condition can be distinguished from the gate characteristics of the transistor 108 while in the partially-reversed SBD condition. In addition, the transistor 108 can be repeatedly transitioned between the SBD condition and the reversed, or at least partially reversed, SBD condition by application of the applicable pulse voltage. As a result, the two conditions can be treated as respective memory states. For example, the SBD condition represented by line 182 can be treated as a PROGRAM condition of the memory cell 102, and the at least partially reversed SBD condition represented by line 184 can be treated as an ERASE condition of the memory cell 102.

Figure 13:
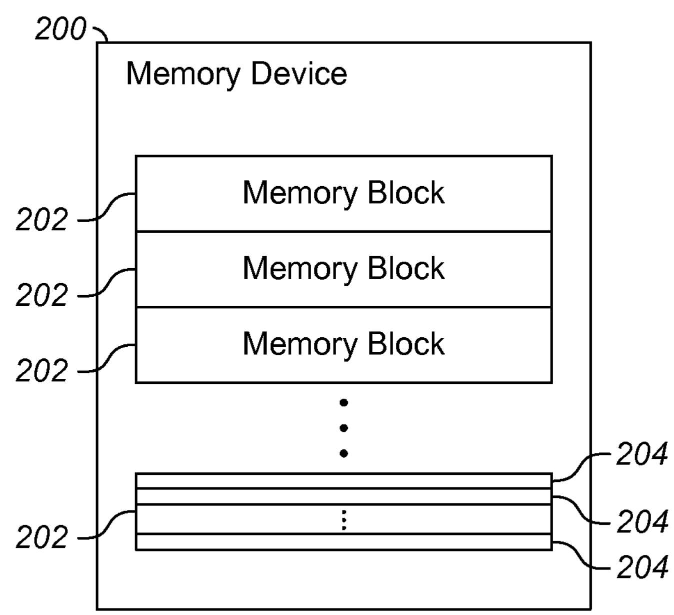
FIG. 13 shows a block diagram of a memory device that includes the memory array shown in FIG. 1.

Referring next to FIG. 13, along with FIGS. 1 and 2, the operation of a rewritable memory embodiment of the memory array 100 will be described. In general, the voltage levels of the word lines WL1-WL3, bit lines BL1-BL3, and source line SL, as well as the state of the ground select transistors GST and string select transistors SST can be controlled in order to program, erase, and read any desired memory cell of the memory array 100. The more detailed description that follows of the operation of the memory array 100 makes specific reference to one or more particular memory cells of the memory array 100; however, those skilled in the art will appreciate that the description applies equally to other memory cells of the memory array 100, and also applies equally to alternative embodiments of the memory array 100 that include additional memory cells, bit lines, word lines, ground select transistors, string select transistors, and/or other components.

The memory array 100 can be part of a memory device 200 that is organized into a plurality of blocks 202, with each of the blocks 202 being further organized into pages 204. For example, in one embodiment, a 2-Gbit embodiment of the memory device 200 can include 2048 blocks 202, with 64 pages 204 per block 202, and with 2112 bytes per page 202, such that the memory device 200 is grouped into a series of 128-kbyte blocks 202. Alternative embodiments can include additional or fewer bits of memory, blocks 202, pages 204, and/or bytes per page 204.

The memory device 100 can also include a multi-bit interface (not shown) for data transfer to and from the memory array 100, for example an 8- or 16-bit interface. Incoming data can be written to memory as binary data that is stored as a logic level 1 or a logic level 0. The memory device 200 can be initialized such that memory cells 102 are initially set to either a logic level 1 or a logic level 0. After initialization, erase and program operations can be used to write data to the memory cells 102. The erase operation can store a logic level "1" in a memory cell 102. The program operation can store a logic level "0" in a memory cell 102. In some embodiments, the erase operation is performed on a block 202 of the memory device 200 at a time, and the program operation can be performed on a byte of memory at a time.

The program operation changes the state of erased bits to a condition representative of logic level 0. The program operation accomplishes this transition by inducing an SBD condition on the transistor 108 of the memory cell 102 selected for programming. For example, in embodiments described above, the SBD condition can be induced by applying a word line WL voltage of 4.3 V to the selected memory cell 102. The remaining memory cells 102 of the memory array 100 can be maintained below the SBD-inducing voltage level.

For example, referring to FIG. 1, a selected memory cell 102 (outlined by the broken box) can be programmed by raising the voltage of word line WL1 to 4.3 V while the bit line BL3 is set to 0 V. Meanwhile, the remaining word lines WL2 and WL3 are raised to 3.3 V, and the remaining bit lines BL1 and BL2 are also raised to 3.3 V. As a result, the unselected memory cells 102 are program-inhibited since the voltage potential across the unselected memory cells 102 is less than the voltage required for inducing the SBD condition. Also, the string select transistor SST of the third memory string MS3 is turned on, for example by raising the voltage of the string select line SSL to be at or above the threshold voltage Vth of the string select transistor SST, for example 3.3 V. Since the voltage of bit line BL3 is 0 V, and the voltage of bit lines BL1 and BL2 is 3.3 V, only the string select transistor SST of the third memory string MS3 is turned on; the remaining string select transistors SST of the first and second memory strings MS1 and MS2 remain off. The ground select transistor GST of the third memory string MS3 can remain off, and the source line SL can be floating. As a result, the voltage across the selected memory cell 102 at the intersection of word line WL1 and bit line BL3 is at least high enough to induce the SBD condition in the transistor 108 of the selected memory cell 102, so the selected memory cell 102 is programmed.

As another example, still referring to FIG. 1, the selected memory cell 102 (outlined by the broken box) can be programmed by raising the voltage of word line WL1 to 4.3 V while the bit line BL3 is set to 0 V. Meanwhile, the remaining word lines WL2 and WL3 are raised to 3 V, and the remaining bit lines BL1 and BL2 are also raised to 1 V. As a result, the unselected memory cells 102 are program-inhibited since the voltage potential across the unselected memory cells 102 is less than the voltage required for inducing the SBD condition. Also, the string select transistor SST of the third memory string MS3 is turned on, for example by raising the voltage of the string select line SSL to be at or above the threshold voltage Vth of the string select transistor SST, for example 1 V where the threshold voltage of the string select transistor SST is 0.7 V. Since the voltage of bit line BL3 is 0 V, and the voltage of bit lines BL1 and BL2 is 1 V, only the string select transistor SST of the third memory string MS3 is turned on; the remaining string select transistors SST of the first and second memory strings MS1 and MS2 remain off. The ground select transistor GST of the third memory string MS3 can remain off, and the source line SL can be floating. As a result, the voltage across the selected memory cell 102 at the intersection of word line WL1 and bit line BL3 is at least high enough to induce the SBD condition in the transistor 108 of the selected memory cell 102, so the selected memory cell 102 is programmed.

The erase operation changes the state of programmed bits to a condition representative of logic level 1. The erase operation accomplishes this transition by at least partially reversing an SBD condition of the transistor 108 of the memory cell 102 being erased. For example, in embodiments described above, the SBD condition can be at least partially reversed by applying a word line WL voltage of −4.3 V across the memory cell 102. In other words, the word line WL of the memory cell 102 being programmed is set to a voltage potential that is 4.3 V lower than that of the substrate well of the transistor 108 of the memory cell 102 being programmed.

For example, referring to FIG. 1, a selected memory cell 102 (outlined by the broken box) can be erased by a erase process that includes a block-erase step of erasing all of the memory cells 102 of the array 100. After the block-erase, any memory cells 102 that should be storing a logic level 0 can be re-programmed to logic level 0. The erase process includes setting the voltage of word lines WL1-WL3 to 0 V, while the substrate well is set to 4.3 V. Also, the string select transistors SST and ground select transistors GST of the first through third memory strings MS1-MS3 are turned off, for example by raising the voltage of the string select line SSL and the ground select line GSL to about the same voltage as the well voltage of 4.3 V, yielding a net voltage potential across the string select transistors SST and across the ground select transistors GST of 0 V. The bit lines BL1-BL3 and the source line SL can be floating. As a result, the negative WL voltage potential across the memory cells 102 of the memory array 100 is at least high enough to at least partially reverse the SBD condition in the transistors 108 of the memory cells 102, so the memory cells 102 are thus erased. It will be appreciated that some erase processes can include erase-state verification and repeating of the block-erase process described above if an insufficient number of memory cells 102 have been erased.

The read operation detects the state of a selected memory cell 102 in order to determine whether the selected memory cell 102 is set to a condition representative of logic level 0 or logic level 1. The read operation detects the logic level of the selected memory cell 102 by applying a read voltage Vread to the word line associated with the selected memory cell 102, which in this example is word line WL 1. As shown in FIG. 4, the threshold voltage Vth of the transistor 108 depends on whether the transistor 108 is set to an SBD condition or an at least partially reversed SBD condition. When the transistor 108 is in the SBD condition, the gate resistance Rg is relatively lower, so the threshold voltage Vth is set to the relatively higher threshold voltage $Vth_{high}$. On the other hand, when the transistor 108 is in the at least partially reversed SBD condition, the gate resistance Rg is relatively higher, so the threshold voltage Vth is set to the relatively lower threshold voltage $Vth_{low}$. Thus, the condition of the transistor 108, and likewise the memory state of the on the memory cell 102, can be detected by detecting whether the threshold voltage of the transistor 108 is the high threshold voltage $Vth_{high}$ or the low threshold voltage $Vth_{low}$. As a result, the logic level of the selected memory cell 102 can be detected by applying a gate voltage to the transistor 108 of the selected memory cell 102 that is selected such that the transistor 108 will turn on only if the threshold voltage Vth of the transistor is set to the low threshold voltage $Vth_{low}$. Thus, the applied gate voltage should be selected to be greater than, or equal to, the low threshold voltage $Vth_{low}$ and less than the high threshold voltage $Vth_{high}$.

For example, the memory state of the selected memory cell 102 can be detected by applying a read voltage Vread to the word line WL across the memory cell 102. The read voltage Vread is selected such that the $V_{GS}$ of the transistor 108 of the selected memory cell 102 is less than the high threshold voltage $Vth_{high}$ and greater than or equal to the low threshold voltage $Vth_{low}$. The remaining memory cells 102 of the memory string MS3 are operated in pass-through mode. Since the memory state of the remaining memory cells 102 of the memory string MS3 can be logic level 1 or logic level 0, the $V_{GS}$ applied to these memory cells 102 should be greater than or equal to the high threshold voltage $Vth_{high}$ in order to operate the transistors 108 in pass through mode regardless of the memory state of the memory cells 102. Also, the string select transistor SST and ground select transistor GST of the memory string MS3 are turned on, and the voltage level of the bit line BL3 is raised so that the $V_{DS}$ of the transistor 108 of the selected memory cell 102 will be sufficiently high to pass a detectable drain current Id if the transistor 108 of the selected memory cell 102 is turned on. The string select transistors SST and ground select transistors GST of the remaining memory strings MS1 and MS2 are turned off.

The following table ("Table 1") summarizes the operation of the memory array 100 by way of example using voltage levels according to an embodiment of the memory array 100. The exact voltage levels can vary for different embodiments from those listed in Table 1, particularly where the characteristics of the transistors 108 and resistors 112 vary.

| | | | | | ERASE | | | | |
|---|---|---|---|---|---|---|---|---|---|
| | WRITE | | | BL1 | BL2 | BL3 | READ | | |
| | BL1 0 V | BL2 1 V | BL3 1 V | O-PEN | O-PEN | O-PEN | BL1 1 V | BL2 0 V | BL3 0 V |
| SSL | | 1 V | | | 4.3 V | | | 1 V | |
| WL1 | | 4.3 V | | | 0 V | | | 3 V | |
| WL2 | | 3 V | | | 0 V | | | Vread | |
| WL3 | | 3 V | | | 0 V | | | 3 V | |
| GSL | | 0 V | | | 4.3 V | | | 1 V | |
| SL | | 0 V | | | OPEN | | | 0 V | |
| WELL | | 0 V | | | 4.3 V | | | 0 V | |

Figure 14:
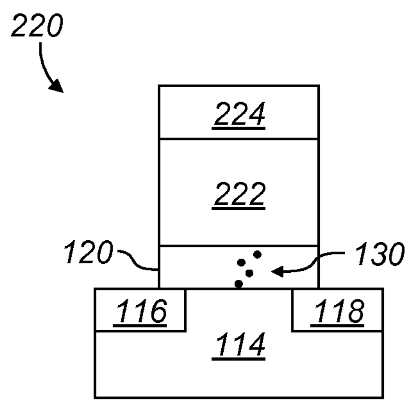
FIG. 14 shows a schematic view of an embodiment of the memory cell of the memory array shown in FIG. 1 and the memory string shown in FIG. 2.

Turning next to FIG. 14, a structure 220 is shown as an embodiment of the memory cell 102. As shown in FIG. 3, the memory cell 102 includes the resistance Rp in series with the gate terminal 122. The structure 220 allows for providing the resistance Rp of the resistor 112 in series with the gate 110 of the transistor 108. The structure 220 includes a high-resistance layer 222 disposed over the gate dielectric layer 120. The structure 220 also includes a low-resistance layer 224 disposed over the high-resistance layer 222. The low-resistance layer 224 can be formed of a low resistance material, for example a silicide, so that the low-resistance layer 224 can serve as a low-resistance gate electrode. The high-resistance layer 222 can be composed of a low-doped polysilicon material. The low-doped polysilicon material of the layer 222 can be formed so as to provide the parasitic capacitance Rp, for example in a range of 1 MΩ to 10 MΩ.

Figure 15:
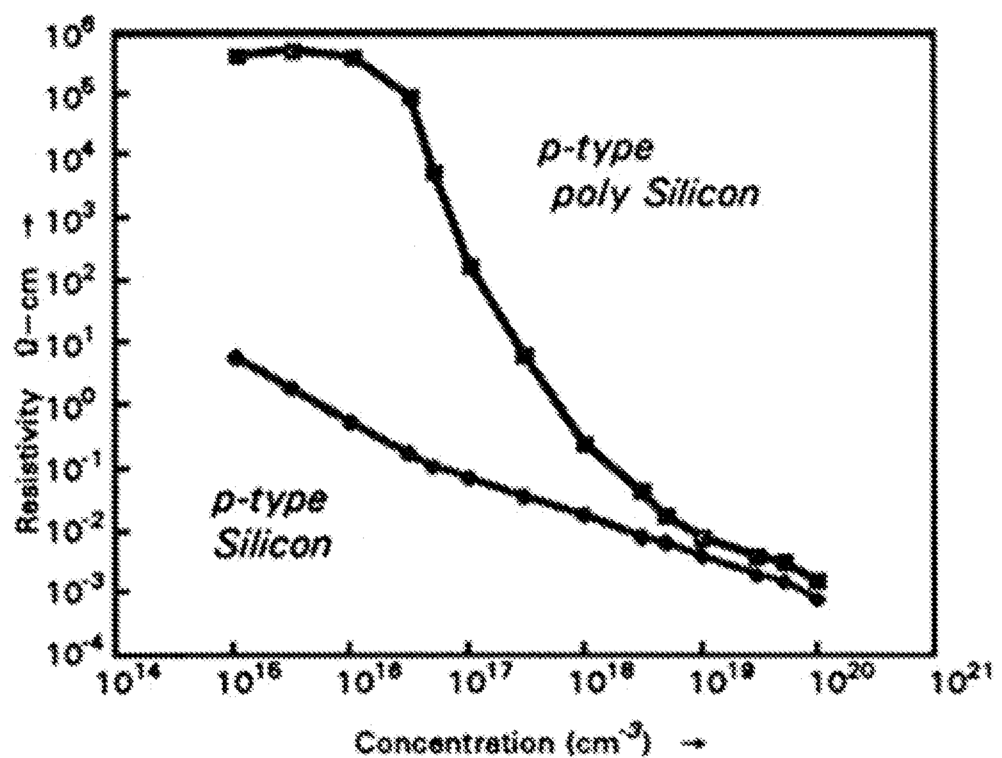
FIG. 15 shows a graphical representation of resistivity characteristics of poly silicon that can be used in the memory cell shown in FIG. 14.

FIG. 15 shows how the doping concentration of a p-type polysilicon material can be selected so as to provide the desired resistivity for the low-resistance layer 224. As shown by the data in FIG. 15, the p-type polysilicon material can be doped at a concentration level that is lower than $10^{17}$ $cm^{3}$ in order to obtain the resistivity greater than $10^{3}$ Ω-cm. Thus, a resistance Rp greater than 10 MΩ at 15 nm node can be obtained for the high-resistance layer 222.

Figure 16:
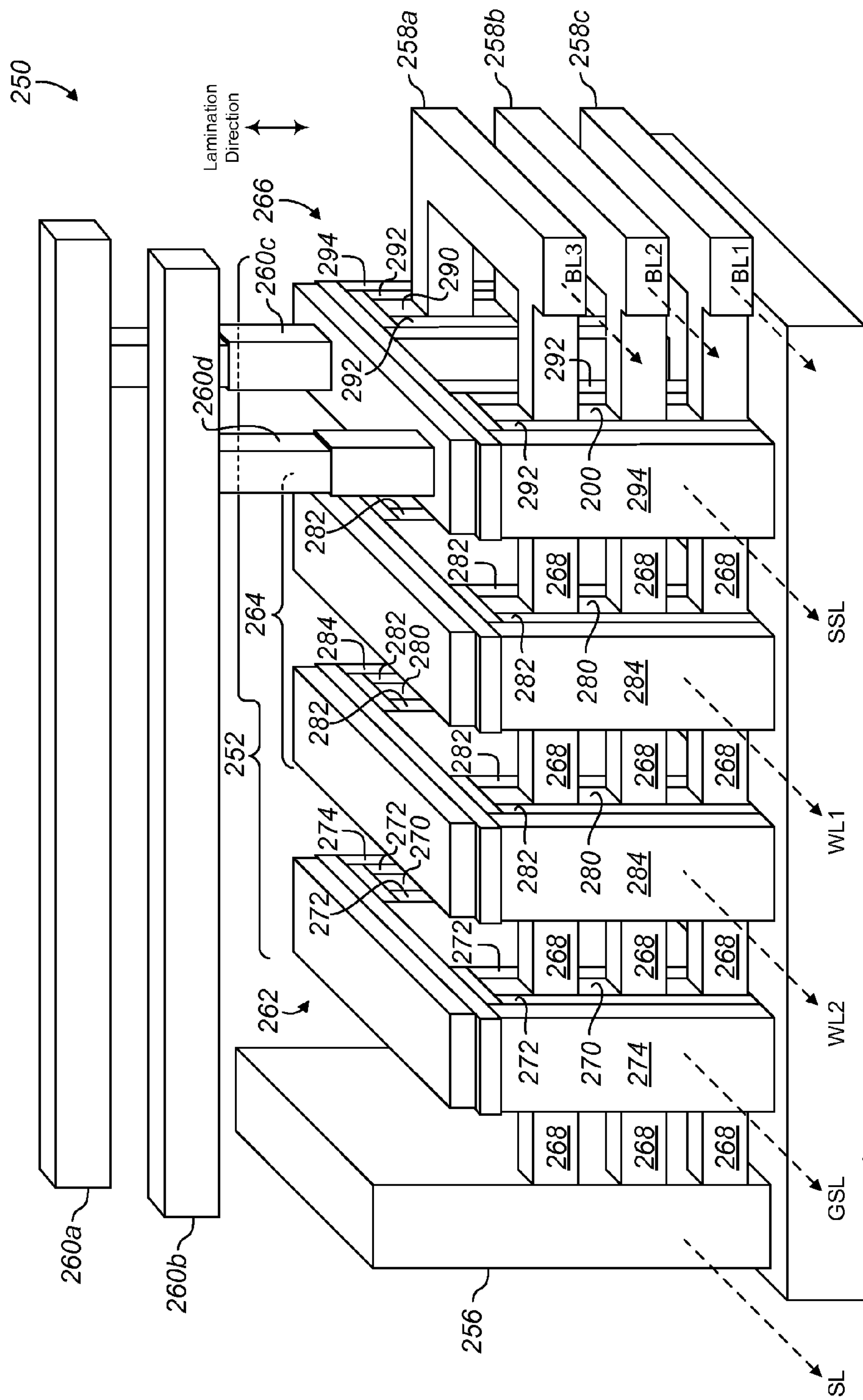
FIG. 16 shows a schematic view of an embodiment of the memory array shown in FIG. 1 having a three-dimensional architecture.

FIG. 16 shows a three-dimensional memory array 250, which serves as an embodiment of the memory array 100 having a three-dimensional architecture. The three-dimensional memory array 250 includes a memory array 252 formed above a substrate 254 in the lamination direction. The memory array 252 is formed between a conductive source-line rail 256 and a series of vertically-spaced bit-line conductors 258*a*-258*c*. A series of conductive SSL lines 260*a*-260*b* are formed above the memory array 252 in the lamination direction. The SSL lines 260*a*-260*b* can be connected to the SST area 266 by conductive vias 260*c* and 260*d*.

The substrate 254 can be formed from a wafer, for example a silicon or other type of wafer. In some embodiments, the substrate 254 can include buried oxide. For example, the substrate 254 can include a silicon-on-insulator (SOI) material.

The conductive source-line rail 256 can serve as a common source line for the memory array 250. The bit-line conductors 258*a*-258*c* can serve as bit lines BL1-BL3, respectively. The conductive source-line rail 256, bit-line conductors 258*a*-258*c*, and SSL lines and vias 260*a*-260*d* can be formed of a conductive material, for example tungsten.

The memory array 252 includes GST area 262, memory cell area 264, and SST area 266. A plurality of conductive channels 268 provide desired conductive interconnections between the GST area 262, memory cell area 264, and SST area 266. The conductive channels 268 can be formed of a conductive material, for example tungsten.

The GST area 262 includes memory columnar semiconductor layers 270. Memory gate insulation layers 272 are formed on respective sidewalls of the memory columnar semiconductor layers 270. Gate structures 274 are formed on respective sidewalls of the memory gate insulation layers 272. Memory columnar semiconductor layers 270 and gate structures 274 can be formed of polysilicon. Portions of the memory columnar semiconductor layers 270 can be formed of $p^+$ and $n^+$ doped polysilicon. The memory gate insulation layers 272 can be formed of gate dielectric material, for example silicon oxide.

The memory cell area 264 includes memory columnar semiconductor layers 280. Memory gate insulation layers 282 are formed on respective sidewalls of the memory columnar semiconductor layers 280. Gate structures 284 are formed on respective sidewalls of the memory gate insulation layers 282. Memory columnar semiconductor layers 280 and gate structures 284 can be formed of polysilicon. Portions of the memory columnar semiconductor layers 280 can be formed of $p^+$ and $n^+$ doped polysilicon. The memory gate insulation layers 282 can be formed of gate dielectric material, for example silicon dioxide ($SiO_2$) or high-K material such as hafnium dioxide ($HfO_2$), zirconium dioxide ($ZrO_2$), and titanium dioxide ($TiO_2$).

The SST area 266 includes memory columnar semiconductor layers 290. Memory gate insulation layers 292 are formed on respective sidewalls of the memory columnar semiconductor layers 290. Gate structures 294 are formed on respective sidewalls of the memory gate insulation layers 292. Memory columnar semiconductor layers 290 and gate structures 294 can be formed of polysilicon. Portions of the memory columnar semiconductor layers 290 can be formed of $p^+$ and $n^+$ doped polysilicon. The memory gate insulation layers 292 can be formed of gate dielectric material, for example silicon oxide.

Thus, in accordance with the present disclosure, a 1 T MOSFET memory can be provided that uses gate-resistance Rg change for shifting the threshold voltage of the memory transistor. With a series-connected resistance Rp, the gate resistance Rg change causes significant shift in the threshold voltage Vth. Preferrably, the Rg (after soft breakdown) and Rp can be in a comparable range of resistances. The difference in drain current Id or threshold voltage Vth can be used in order to determine whether the memory state of a memory cell is a logic level 1 or 0. The memory cells can be operated as a four-terminal device, including the gate/resistances Rp and Rg, the source, the drain, and the well. Various high-K materials or RRAM-like materials can be used as the gate resistance Rg material. A NAND-like array architecture can be used for the presently disclosed memory device. The memory cells can be manufactured within a 4 $F^2$ design rule. A three-dimensional NAND-like architecture can also be used in order to offer ultra-high memory density, for example of 1 Tbit capacity.

Compared to an RRAM, the presently disclosed memory cells can use RRAM material on the gate dielectric of a MOSFET transistor, and in the presently disclosed memory cell, the program/erase operation utilizes the gate resistance change rather than the storage of electric charges. The programming current of the present memory cells can be much lower than that of an RRAM, since the present memory cells do not require a large current for the breakdown of the material because the present memory cells route the sensing current through the drain of the transistor. The present memory cell also does not suffer from few-electron charge storage problems since resistance change of the gate is used rather than charge storage for data storage.

The present memory cell can include an ultra-thin gate oxide (~1 nm) MOSFET in a memory array having 4 $F^2$ memory cells. Thus, very scaled devices (e.g., channel length/width<10 nm) are possible for the present memory arrays because the ultra-thin oxide MOSFET is scalable below 10 nm.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed is:

1. A memory device comprising an array of memory cells, at least one of the memory cells comprising:

a transistor having a first terminal, a second terminal, and a gate structure, the gate structure including a gate dielectric layer and a low-resistance layer, and the gate dielectric layer being switchable between first and second different resistances associated with respective first and second memory states; and a resistor in series with the gate structure of the transistor, the resistor including a high-resistance conductor disposed between the gate dielectric layer and the low-resistance layer, and the high-resistance conductor including a doped semiconductor material.

2. The memory device of claim 1, wherein the first resistance of the gate dielectric is associated with a soft breakdown (SBD) condition of the transistor.

3. The memory device of claim 2, wherein the second resistance of the gate dielectric is associated with an at least partially reversed SBD condition of the transistor.

4. The memory device of claim 3, wherein the transistor further includes a well terminal.

5. The memory device of claim 4, wherein at least one of a read, program, and erase operation includes application of a predetermined voltage to the well terminal.

6. The memory device of claim 5, wherein the program operation includes application of the predetermined voltage to the gate structure, and the erase operation includes application of the predetermined voltage to the well terminal.

7. The memory device of claim 6, wherein the program operation induces the SBD condition of the transistor.

8. The memory device of claim 7, wherein the erase operation at least partially reverses the SBD condition of the transistor.

9. The memory device of claim 1, wherein the gate dielectric layer includes at least one of silicon dioxide ($SiO_2$), hafnium dioxide ($HfO_2$), zirconium dioxide ($ZrO_2$), and titanium dioxide ($TiO_2$).

10. The memory device of claim 1, wherein the semiconductor material includes polysilicon.

11. A memory device comprising:

a bit line;

a word line;

a memory string connected to the bit line and comprising a memory cell, the memory cell comprising a transistor, the transistor having a first terminal, a second terminal, and a gate structure, the gate structure including a gate dielectric layer and a low-resistance layer, and the gate dielectric layer being switchable between first and second different resistances associated with respective first and second memory states;

a common source line connected to the memory string, the memory cell being connected between the common source line and the bit line; and a resistor that is electrically in series between the gate dielectric layer of the transistor and the word line, the resistor including a high-resistance layer in physical contact with the gate dielectric layer and the low-resistance layer and disposed between the gate dielectric layer and the low-resistance layer, and the high-resistance layer including a doped semiconductor material, wherein the first memory state corresponds to the transistor of the memory cell having a high threshold voltage and the second memory state corresponds to the transistor of the memory cell having a low threshold voltage.

12. The memory device of claim 11, wherein the first resistance of the gate dielectric is associated with a soft breakdown (SBD) condition of the transistor.

13. The memory device of claim 12, wherein the second resistance of the gate dielectric is associated with an at least partially reversed SBD condition of the transistor.

14. The memory device of claim 13, wherein the transistor further includes a well terminal.

15. The memory device of claim 14, wherein at least one of a read, program, and erase operation includes application of a predetermined voltage to the well terminal.

16. The memory device of claim 15, wherein the program operation includes application of the predetermined voltage to the gate structure, and the erase operation includes application of the predetermined voltage to the well terminal.

17. The memory device of claim 16, wherein the program operation induces the SBD condition of the transistor.

18. The memory device of claim 17, wherein the erase operation at least partially reverses the SBD condition of the transistor.

19. The memory device of claim 11, wherein the gate dielectric layer includes at least one of silicon dioxide ($SiO_2$), hafnium dioxide ($HfO_2$), zirconium dioxide ($ZrO_2$), and titanium dioxide ($TiO_2$).

20. The memory device of claim 11, wherein the memory cell is a first memory cell, and wherein the memory device further comprises a second memory cell formed above the first memory cell in a lamination direction such that the first and second memory cells are included in a three-dimensional memory array.

* * * * *